United States Patent
Cheon

(10) Patent No.: US 10,402,098 B2
(45) Date of Patent: Sep. 3, 2019

(54) NONVOLATILE MEMORY APPARATUS AND VERIFICATION WRITE METHOD THEREOF FOR REDUCING PROGRAM TIME

(71) Applicant: SK hynix Inc., Icheon-si Gyeonggi-do (KR)

(72) Inventor: Jun Ho Cheon, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/275,623

(22) Filed: Sep. 26, 2016

(65) Prior Publication Data

US 2017/0262171 A1 Sep. 14, 2017

(30) Foreign Application Priority Data

Mar. 14, 2016 (KR) .................. 10-2016-0030240

(51) Int. Cl.
*G06F 3/06* (2006.01)
*G11C 13/00* (2006.01)

(52) U.S. Cl.
CPC ............ *G06F 3/061* (2013.01); *G06F 3/0655* (2013.01); *G06F 3/0688* (2013.01); *G11C 13/0064* (2013.01); *G11C 13/0069* (2013.01); *G11C 13/0004* (2013.01); *G11C 2013/0066* (2013.01); *G11C 2013/0078* (2013.01); *G11C 2213/15* (2013.01)

(58) Field of Classification Search
None
See application file for complete search history.

(56) References Cited

U.S. PATENT DOCUMENTS

| 7,719,913 | B2 | 5/2010 | Lung et al. | |
| 9,171,617 | B1* | 10/2015 | Park | G11C 13/0069 |
| 2010/0103726 | A1* | 4/2010 | Bae | G11C 5/143 |
| | | | | 365/163 |
| 2011/0299320 | A1* | 12/2011 | Kono | G11C 11/56 |
| | | | | 365/148 |
| 2012/0026778 | A1* | 2/2012 | Maejima | G11C 8/08 |
| | | | | 365/148 |
| 2013/0235648 | A1* | 9/2013 | Kim | G11C 13/0069 |
| | | | | 365/148 |
| 2016/0148685 | A1* | 5/2016 | Roy | G11C 13/0069 |
| | | | | 365/148 |

FOREIGN PATENT DOCUMENTS

KR 10-1095829 B1 12/2011

* cited by examiner

*Primary Examiner* — J. H. Hur
(74) *Attorney, Agent, or Firm* — William Park & Associates Ltd.

(57) ABSTRACT

A non-volatile memory apparatus may include a program current generation circuit, a clamping circuit and a voltage generation circuit. The program current generation circuit may increase a program current based on a memory cell current flowing through a memory cell. The clamping circuit may clamp the memory cell current. The voltage generation circuit may apply a voltage corresponding to a verification-write voltage to the memory cell. Therefore, the verification-write operation may be performed to the memory cell.

16 Claims, 7 Drawing Sheets

NONVOLATILE MEMORY APPARATUS AND VERIFICATION WRITE METHOD THEREOF FOR REDUCING PROGRAM TIME

CROSS-REFERENCES TO RELATED APPLICATION

The present application claims priority under 35 U.S.C. § 119(a) to Korean application number 10-2016-0030240 filed on Mar. 14, 2016 in the Korean Intellectual Property Office, which is incorporated herein by reference in its entirety.

BACKGROUND

1. Technical Field

Various embodiments generally relate to a semiconductor apparatus, and more particularly to a non-volatile memory apparatus and a verification-write operation thereof.

2. Related Art

A dynamic random access memory (DRAM) stores data in a capacitor by electrically charging the capacitor. The DRAM is a volatile memory because the capacitor naturally discharges, and thus the DRAM needs to be refreshed periodically. A non-volatile memory does not have to perform a refresh operation in order to retain stored data. Today, one of the most prominent emerging memory categories is a resistive memory. The resistive memory is a type of non-volatile memory that stores data by changing the resistance of its resistive memory cell. Example of the resistive memory may include a phase-change random access memory and a resistive random-access memory.

The resistive memory apparatus may include a memory cell formed with a material showing electrically induced resistive switching effects. For example, where the resistance of the material is variable according to an amount of current running through the material, data may be stored in the memory cell of the resistive memory apparatus by adjusting the amount of current applied to the memory cell. The resistive state of a particular bit of data can be either high or low. For example, a low-resistance state may be defined as a "set" data (set state), and a high-resistance state may be defined as a "reset" data (reset state).

While a program operation is being performed on the resistive memory apparatus, verification operations may be performed to check whether the data has been correctly written. For example, during a reset program operation, the resistive memory apparatus may write the reset data into the memory cell by applying a reset program current to the memory cell. And then, the resistive memory apparatus may perform a verification-read operation to check whether the reset data has been correctly written. When the reset data is read out during the verification-read operation, the reset program operation is determined to have been completed. When the data read out during the verification-read operation is not the reset data, the reset program operation is determined to have not been completed, and the reset program operation and the verification-read operation may be repeated.

SUMMARY

In an embodiment of the present invention, a non-volatile memory apparatus may include a voltage generation circuit, a program current generation circuit, and a clamping circuit. The voltage generation circuit may be coupled to a memory cell, and may receive a verification-write voltage to provide a voltage for checking the memory cell. The program current generation circuit may increase a program current based on a memory cell current running through the memory cell. The clamping circuit may be coupled to the voltage generation circuit, and may clamp the memory cell current to maintain a range of the memory cell current below the program current.

In an embodiment of the present invention, a non-volatile memory apparatus may include a clamping circuit, a voltage generation circuit, a sense amplifier, a program controller, a clamping controller. The clamping circuit may prevent a memory cell current running through a memory cell from exceeding a program current in response to a clamping control signal. The voltage generation circuit may receive a verification-write voltage and apply a sensing voltage to the memory cell. The sense amplifier may generate a detection signal by detecting a memory cell current running through the memory cell. The program controller may generate a current update signal and a program end signal based on the detection signal. The clamping controller may generate a clamping control signal by increasing an amount of the program current according to the current update signal.

In an embodiment of the present invention, a verification-write method of a non-volatile memory apparatus for programming a memory cell may be performed. The method may include clamping a memory cell current running through the memory cell to maintain a range of the memory cell current below a predetermined program current. The method may include performing a verification-read operation and a verification-write operation at the same time by applying a verification-write voltage to the memory cell. The method may include increasing the program current based on whether a snap-back occurs to the memory cell current.

BRIEF DESCRIPTION OF THE DRAWINGS

Features, aspects and embodiments are described in conjunction with the attached drawings, in which.

DETAILED DESCRIPTION

Hereinafter, a semiconductor apparatus according to various embodiments of the present invention will be described below with reference to the accompanying drawings.

Figure 1:
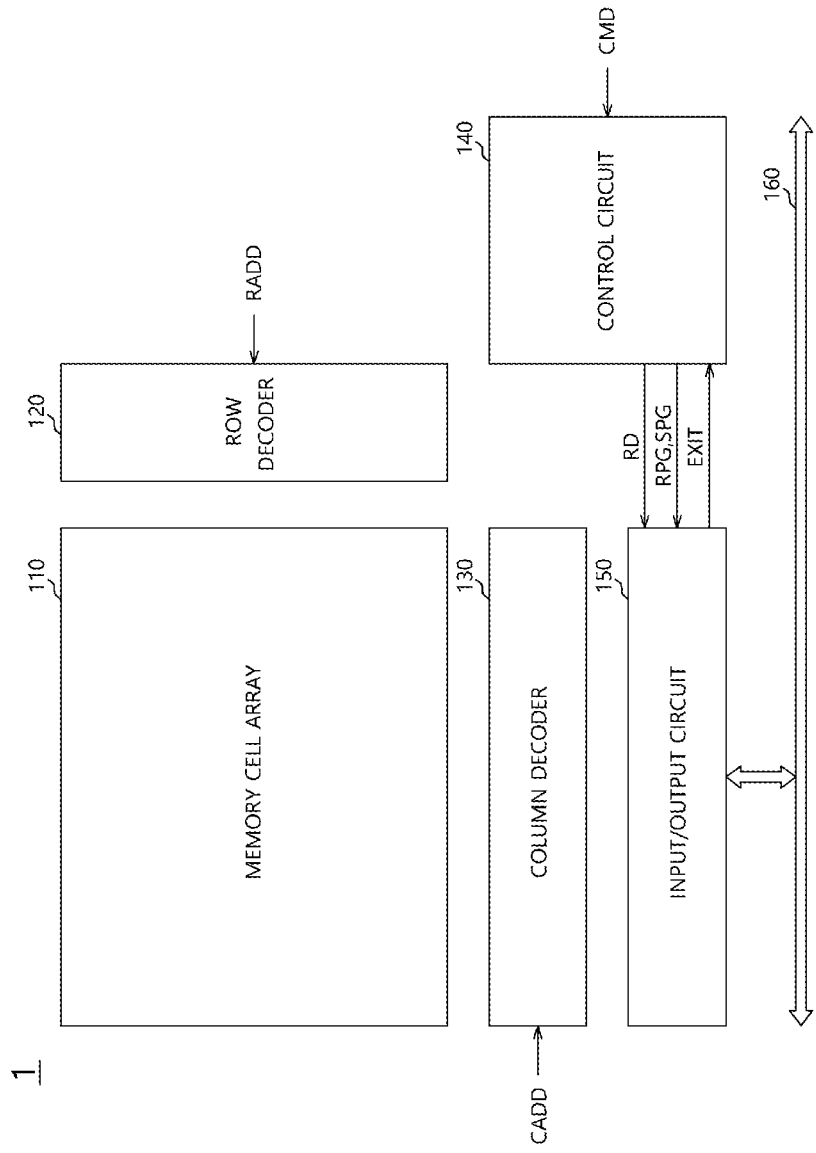
FIG. 1 is a diagram illustrating an example of a non-volatile memory apparatus in accordance with an embodiment.

FIG. 1 is a diagram illustrating an example of a non-volatile memory apparatus 1 in accordance with an embodiment. Referring to FIG. 1, the non-volatile memory apparatus 1 may include a memory cell array 110, a row decoder 120, a column decoder 130, a control circuit 140, and an input/output circuit 150. The memory cell array 110 may include a plurality of word lines and bit lines (not illustrated). The memory cell array 110 may include a plurality of memory cells. Each memory cell may be coupled to both the word line and bit line. The memory cells may be resistive memory cells. For example, the memory cells may include resistive elements (e.g., phase-change element) having resistive switching characteristics (e.g. resistance varies according to a program current).

According to a row address signal RADD, the row decoder 120 may select one of the plurality of word lines disposed in the memory cell array 110. According to a column address signal CADD, the column decoder 130 may select one of the plurality of bit lines disposed in the memory cell array 110. Upon selection of the word line and the bit line respectively by the row decoder 120 and the column decoder 130, a memory cell coupled to the selected word line and selected bit line may be accessed.

The control circuit 140 may perform write and read operations on the memory cell array 110 in response to a command signal CMD. The control circuit 140 may generate a reset program signal RPG and a set program signal SPG for the program (write) operation based on the command signal CMD. The reset program signal RPG may be a control signal that instructs the memory cell array 110 to write reset data into the accessed memory cell, and the set program signal SPG may be a control signal that instructs the memory cell array 110 to write set data into the accessed memory cell. The control circuit 140 may generate a read signal RD for the read operation based on the command signal CMD. The read signal RD may be a control signal that instructs the memory cell array 110 to output data stored in the accessed memory cell. Also, the control circuit 140 may provide one or both of internal voltages and clock signals, and may set information regarding various operations of the non-volatile memory apparatus 1.

In response to the read signal RD, the input/output circuit 150 may generate an output data signal by sensing current running through the accessed memory cell, and may transmit the output data signal to a data transmission line 160. The input/output circuit 150 may perform the set program operation on the memory cell (write the set data into the memory cell) in response to the set program signal SPG. The input/output circuit 150 may perform the reset program operation on the memory cell (write the reset data into the memory cell) in response to the reset program signal RSPG. In an embodiment of the present disclosure, the input/output circuit 150 may perform a verification-write operation in order to program the memory cell into the reset state. For example, the verification-write operation may be an operation that includes a verification-read operation and the write operation performed at the same time. The input/output circuit 150 may perform the verification-read operation in response to the reset program signal RPG, and may perform the verification-read operation and the write operation at the same time. The input/output circuit 150 may provide current for the reset program operation to the memory cell and perform the verification-read operation at the same time. When the programming of the accessed memory cell into the set state or the reset state is completed, the input/output circuit 150 may generate a program end signal EXIT.

Figure 2:
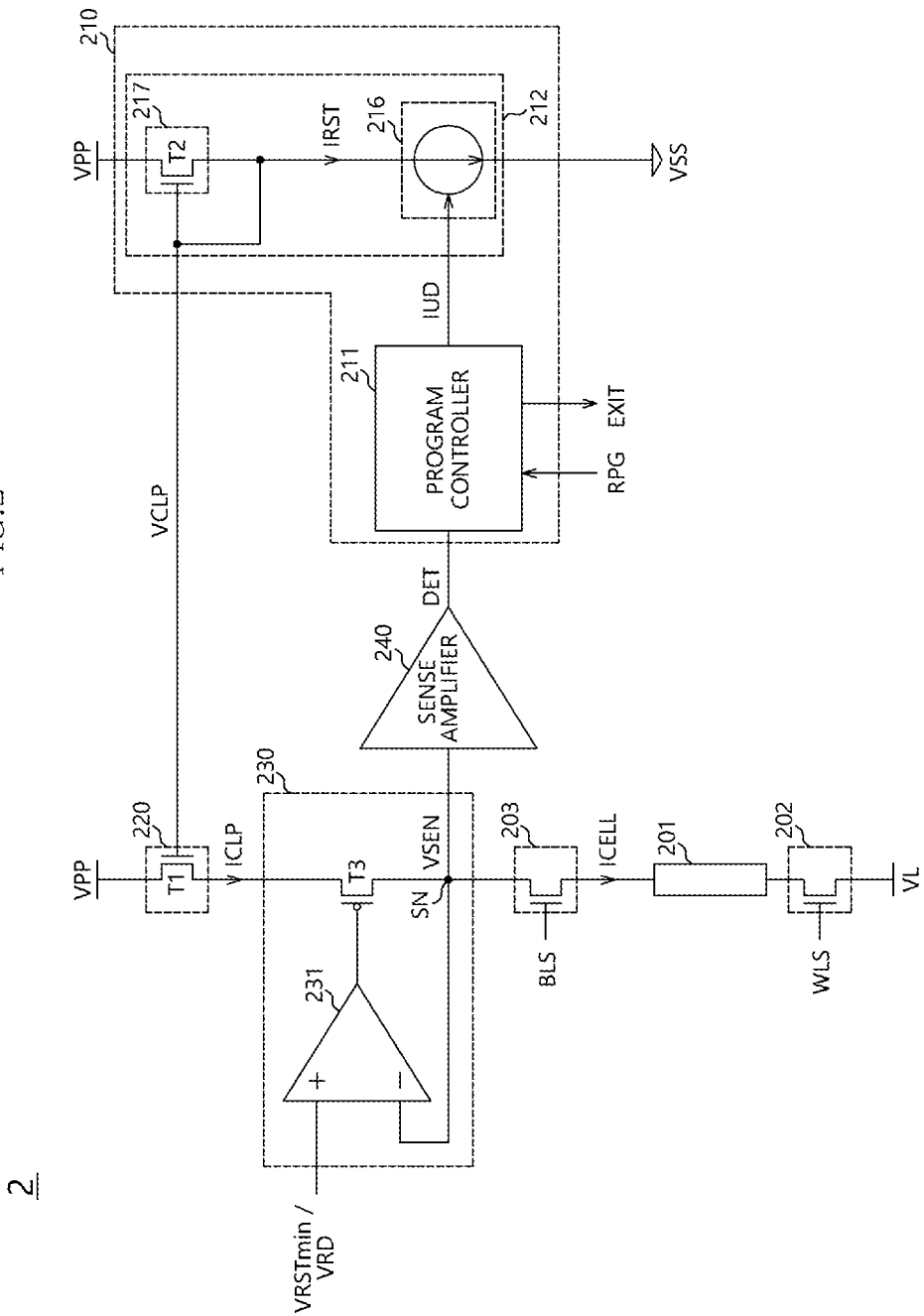
FIG. 2 is a diagram illustrating an example of a non-volatile memory apparatus in accordance with an embodiment.

FIG. 2 is a diagram illustrating an example of a non-volatile memory apparatus 2 in accordance with an embodiment. Referring to FIG. 2, the non-volatile memory apparatus 2 may include a memory cell 201, a word line selection switch 202, a bit line selection switch 203, and an input/output circuit. The word line selection switch 202 may be turned on in response to a word line selection signal WLS generated by the row decoder 120. The word line selection switch 202 may couple one end of the memory cell 201 to a first voltage VL. The first voltage VL may be a ground voltage. Alternatively, the first voltage VL may be a bulk bias voltage. The bulk bias voltage may be a negative voltage higher than the ground voltage. The bit line selection switch 203 may be turned on in response to a bit line selection signal BLS generated by the column decoder 130. The bit line selection switch 203 may couple the other end of the memory cell 201 to the input/output circuit.

The input/output circuit may perform the write and read operations on the memory cell 201 selected by the word line selection signal WLS and the bit line selection signal BLS. The input/output circuit may include a program current generation circuit 210, a clamping circuit 220, and a voltage generation circuit 230. The program current generation circuit 210 may generate program current IRST to program the memory cell 201, and may increase the program current IRST based on memory cell current ICELL running through the memory cell 201. The program current generation circuit 210 may increase the program current IRST according to whether a snap-back occurs to the memory cell current ICELL. The snap-back may be a mechanism that dramatically increases the memory cell current ICELL when the resistance value of the memory cell 201 is lower than a threshold resistance value. The program current generation circuit 210 may increase the program current IRST when the program current IRST exceeds a threshold current value, and may end the program operation when the program current IRST is lower than the threshold current value. Further, the program current generation circuit 210 may increase the program current IRST when the snap-back occurs to the memory cell current ICELL, and may end the program operation when the snap-back does not occur to the memory cell current ICELL. The program current generation circuit 210 may generate a clamping control signal VCLP based on the program current IRST. The clamping control signal VCLP may have a voltage level corresponding to an amount of the program current IRST.

The clamping circuit 220 may clamp the current flowing through the memory cell 201 to prevent the current flowing through the memory cell 201 from exceeding the program current IRST. The clamping circuit 220 may perform the clamping operation in response to the clamping control signal VCLP. In response to the clamping control signal VCLP, the clamping circuit 220 may generate a clamping current ICLP that is substantially the same as the program current IRST, and may provide the clamping current ICLP to the voltage generation circuit 230.

The voltage generation circuit 230 may provide a voltage for checking whether the memory cell 201 is in the reset state or the set state. The voltage generation circuit 230 may generate a sensing voltage VSEN based on verification-write voltage VRSTmin, and may provide the sensing voltage VSEN to the memory cell 201. Here, the sensing voltage VSEN may have substantially the same level as the verification-write voltage VRSTmin. The voltage generation circuit 230 may receive the verification-write voltage VRSTmin and may provide the sensing voltage VSEN to the memory cell 201 during the write operation. Further, the voltage generation circuit 230 may receive the read voltage VRD, and may provide the memory cell 201 with the sensing voltage VSEN having substantially the same level as the read voltage VRD, during the read operation. The verification-write voltage VRST may have higher level than the read voltage VRD. The verification-write voltage VRST and the read voltage VRD may be provided from the control circuit 140 of FIG. 1.

Referring to FIG. 2, the non-volatile memory apparatus 2 may further include a sense amplifier 240. The sense amplifier 240 may generate a detection signal DET by detecting the memory cell current ICELL running through the memory cell 201. The sense amplifier 240 may generate the detection signal DET having a first level when the memory cell current ICELL is greater than the threshold current value. The sense amplifier 240 may generate the detection signal DET having a second level when the memory cell current ICELL is less than the threshold current value. For example, the first level may be a logic high level and the second level may be a logic low level.

Referring to FIG. 2, the program current generation circuit 210 may include a program controller 211 and a clamping controller 212. The program controller 211 may receive the reset program signal RPG and the detection signal DET. The program controller 211 may set an initial value of a current update signal IUD based on the reset program signal RPG. The program controller 211 may generate the current update signal IUD and the program end signal EXIT based on the detection signal DET. The current update signal IUD may be a multi-bit digital signal. The program controller 211 may increase the value of the current update signal IUD in response to the detection signal DET having the first level. The program controller 211 may increase the value of the current update signal IUD every time it receives the detection signal DET having the first level. The program controller 211 may count a number of the detection signal DET having the first level, and may generate the program end signal EXIT when the number of the detection signal DET having the first level reaches a maximum. The program controller 211 may generate the program end signal EXIT when the value of the current update signal IUD reaches a maximum. Also, the program controller 211 may generate the program end signal EXIT in response to the detection signal DET having the second level.

The clamping controller 212 may receive the current update signal IUD and may increase the program current IRST. When the program controller 211 receives the reset program signal RPG and sets the initial value of the current update signal IUD, the clamping controller 212 may generate a program current IRPG having a predetermined value based on the current update signal IUD. The predetermined value may be an initial value of the program current IRST. If the program controller 211 increases the value of the current update signal IUD, the clamping controller 212 may increase the amount of the program current IRST according to the current update signal IUD. The clamping controller 212 may generate the clamping control signal VCLP based on the amount of the program current IRST. The larger the amount of the program current IRST, the higher voltage level the clamping control signal VCLP may have.

The clamping controller 212 may include a variable current source 216 and a clamping control signal generator 217. The variable current source 216 may vary the amount of the program current IRST based on the current update signal IUD. The variable current source 216 may generate the program current IRST, the amount of which increases every time the value of the current update signal IUD increases. The clamping control signal generator 217 may generate the clamping control signal VCLP having the voltage level corresponding to the amount of the program current IRST.

Referring to FIG. 2, the clamping circuit 220 may include a first transistor T1 coupled to a terminal providing a program voltage VPP. The first transistor T1 may receive the clamping control signal VCLP at its gate, may receive the program voltage VPP at its drain, and may be coupled to the voltage generation circuit 230 at its source. The clamping control signal generator 217 may include a second transistor T2. The second transistor T2 may be coupled to the first transistor T1 at their gates, may receive the program voltage VPP at its drain, and may be coupled to the variable current source 216 at its drain. The clamping circuit 220 together with the clamping control signal generator 217 may have a structure of a current mirror. Therefore, the clamping circuit 220 may generate the clamping current ICLP having substantially the same amount as the program current IRST in response to the clamping control signal VCLP.

The voltage generation circuit 230 may include a comparator 231 and a third transistor T3. The comparator 231 may receive the verification-write voltage VRSTmin or the read voltage VRD at its first input node. A second input node of the comparator 231 may be coupled to a sensing node SN. The sensing node SN may be coupled to the voltage generation circuit 230, the bit line selection switch 203, and the sense amplifier 240. The third transistor T3 may be coupled to an output node of the comparator 231 at its gate, may be coupled to the source of the first transistor T1 at its drain, and may be coupled to the sensing node SN at its source. The voltage generation circuit 230 may generate the sensing voltage VSEN at the sensing node SN. The sensing voltage VSEN may have substantially the same level as the verification-write voltage VRSTmin or the read voltage VRD.

Figure 3:
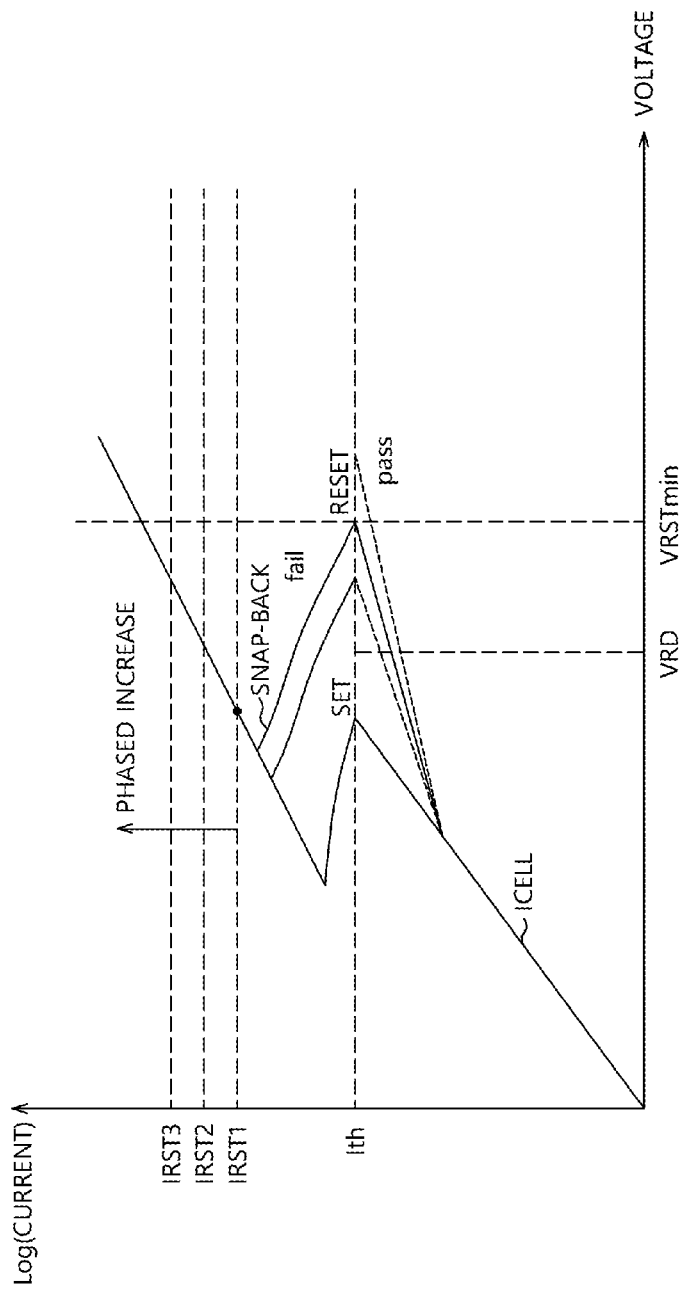
FIG. 3 is a current-voltage graph illustrating snap-back phenomena occurring according to a resistance value of a memory cell in a non-volatile memory apparatus.

FIG. 3 is a current-voltage graph illustrating the snap-back phenomena occurring according to the resistance value of the memory cell 201 in the non-volatile memory apparatus 2. Referring to FIG. 3, an x-axis represents a voltage level and a y-axis represents a log-scaled amount of current. The amount of the memory cell current ICELL flowing through the memory cell 201 may become greater as the level of the voltage applied to the memory cell 201 increases. A general verification-read operation may be performed by applying the read voltage VRD to the memory cell 201. When the memory cell 201 is in the set state, the memory cell 201 may have a low resistance value. Therefore, the memory cell current ICELL flowing through the set-state memory cell 201 may rapidly increase to reach the threshold current Ith. When the memory cell current ICELL is greater than the threshold current Ith, the snap-back may occur. If the snap-back occurs, the amount of the memory cell current ICELL may be dramatically increased. When the memory cell 201 is in the reset state, the memory cell 201 may have a high resistance value. Therefore, the memory cell current ICELL flowing through the memory cell 201 of the reset state may increase more slowly than the memory cell current ICELL flowing through the memory cell 201 of the set state. When the memory cell current ICELL is not greater than the threshold current Ith, it is determined that the reset data has been correctly written in the memory cell 201. By contrast, when the snap-back occurs to the memory cell current ICELL, it is determined that the reset data has not been correctly written in the memory cell 201.

In an embodiment, when the reset program operation is performed, the verification-write voltage VRSTmin may be applied to the memory cell 201. The verification-write voltage VRSTmin may have a higher voltage level than the read voltage VRD. When the memory cell 201 is in the reset state, the memory cell current ICELL may not reach the threshold current Ith, and thus the snap-back may not occur.

Therefore, the reset program operation may end. When the memory cell 201 is not in the reset state, the memory cell current ICELL may reach the threshold current Ith, and thus the snap-back may occur. If the snap-back occurs, the memory cell current ICELL may be increased. At this time, the program current generation circuit 210 and the clamping circuit 220 may clamp the memory cell current ICELL to prevent the memory cell current ICELL flowing through the memory cell 201 from exceeding a first program current IRST1, and thus the memory cell 201 may be programmed with the first program current IRST1. The first program current IRST1 may have an initial value of the program current IRST. Therefore, it may be verified that the reset data has not been correctly written into the memory cell 201, and thus the memory cell 201 may be programmed with the first program current IRST1.

The sense amplifier 240 may generate the detection signal DET having the first level by detecting the memory cell current ICELL. The program current generation circuit 210 and the clamping circuit 220 may increase the program current IRST, and may clamp the memory cell current ICELL to prevent the memory cell current ICELL running through the memory cell 201 from exceeding a second program current IRST2. During the next verification-write operation, if the snap-back does not occur to the memory cell current ICELL, it may be determined that the reset data has been correctly written into the memory cell 201 through the first program current IRST1, and the program operation may end. During the next verification-write operation, if the snap-back occurs again, the memory cell 201 may be programmed with the second program current IRST2. The program current generation circuit 210 and the clamping circuit 220 may increase the program current IRST, and may clamp the memory cell current ICELL to prevent the memory cell current ICELL running through the memory cell 201 from exceeding a third program current IRST3, and then the next verification-write operation may be performed. The non-volatile memory apparatus 2 may perform the verification-read operation and the write operation at the same time by using the program current IRST that gradually increase according to whether the snap-back occurs.

Figure 4:
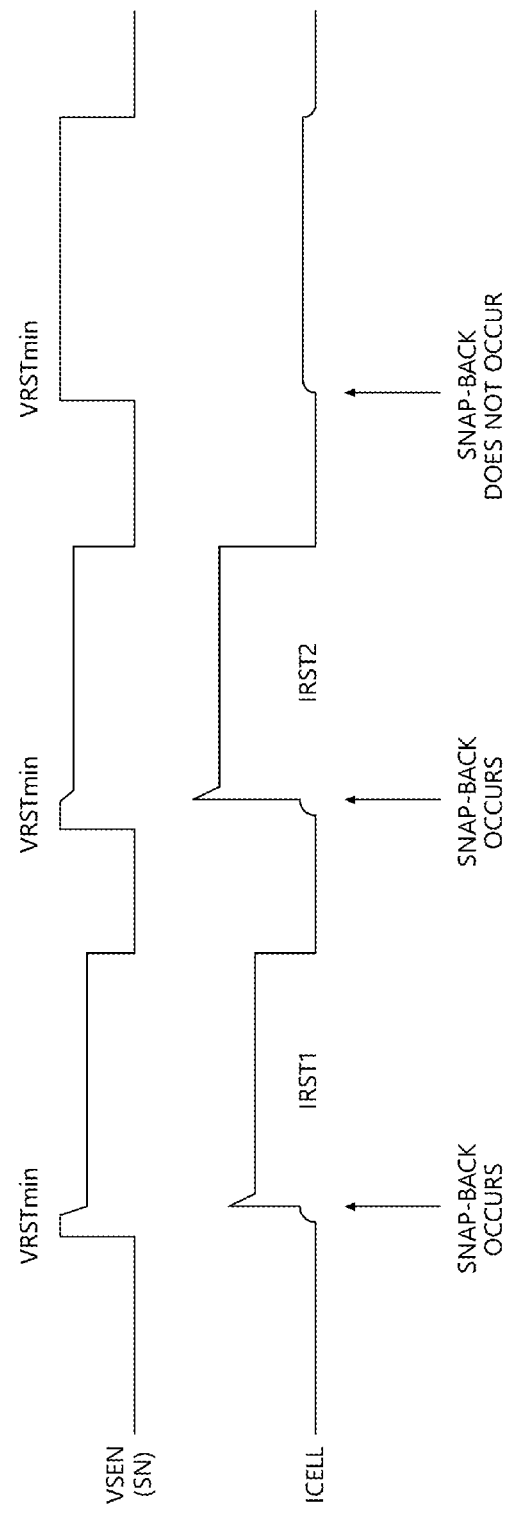
FIG. 4 is a timing diagram illustrating an example operation of a non-volatile memory apparatus in accordance with an embodiment.

FIG. 4 is a timing diagram illustrating an example operation of the non-volatile memory apparatus 2 in accordance with an embodiment of the present disclosure. The operation of the non-volatile memory apparatus 2 will be described hereinafter with reference to FIGS. 2 to 4. During the reset program operation, a first verification-write operation may be performed. The program controller 211 may set the initial value of the current update signal IUD in response to the reset program signal RPG, and the variable current source 216 may generate the first program current IRST1. The clamping controller 212 may generate the clamping control signal VCLP corresponding to the value of the first program current IRST1. The clamping circuit 220 may limit the maximum amount of the memory cell current ICELL flowing through the memory cell 201 to the first program current IRST1. The voltage generation circuit 230 may provide the memory cell 201 with the sensing voltage VSEN corresponding to the verification-write voltage VRSTmin. When the memory cell 201 is not in the reset state, the memory cell current ICELL may increase, and as a result the snap-back may occur to the memory cell current ICELL. If the snap-back occurs, the first program current IRST1 may be applied to the memory cell 201, and thus the memory cell 201 may be programmed with the first program current IRST1. As the memory cell current ICELL running through the memory cell 201 is limited to the first program current IRST1, the voltage level of the sensing node SN may slightly decrease. Also, the sense amplifier 240 may generate the detection signal DET having the first level.

The program controller 211 may increase the value of the current update signal IUD by one step in response to the detection signal DET having the first level. The variable current source 216 may generate the second program current IRST2 greater than the first program current IRST1 in response to the current update signal IUD. The clamping control signal generator 217 and the clamping circuit 220 may limit the maximum amount of the memory cell current ICELL flowing through the memory cell 201 to the second program current IRST2.

The voltage generation circuit 230 may provide the memory cell 201 with the sensing voltage VSEN corresponding to the verification-write voltage VRSTmin to perform a second verification-write operation. If the reset data has not been correctly written into the memory cell 201, the memory cell current ICELL may increase, and as a result the snap-back may occur to the memory cell current ICELL. If the snap-back occurs, the second program current IRST2 may be applied to the memory cell 201, and thus the memory cell 201 may be programmed with the second program current IRST2. As the memory cell current ICELL running through the memory cell 201 is limited to the second program current IRST2, the voltage level of the sensing node SN may slightly decrease. Also, the sense amplifier 240 may generate the detection signal DET having the first level.

The program controller 211 may increase the value of the current update signal IUD by one step in response to the detection signal DET having the first level. The variable current source 216 may generate the third program current IRST3 greater than the second program current IRST2 in response to the current update signal IUD. The clamping control signal generator 217 and the clamping circuit 220 may limit the maximum amount of the memory cell current ICELL flowing through the memory cell 201 to the third program current IRST3.

The voltage generation circuit 230 may provide the memory cell 201 with the sensing voltage VSEN corresponding to the verification-write voltage VRSTmin to perform a third verification-write operation. If the reset data has been correctly written into the memory cell 201, the snap-back may not occur to the memory cell current ICELL. The sense amplifier 240 may generate the detection signal DET having the second level by detecting the memory cell current ICELL. The program controller 211 may generate the program end signal EXIT according to the detection signal DET, and the reset program operation may end.

Figure 5:
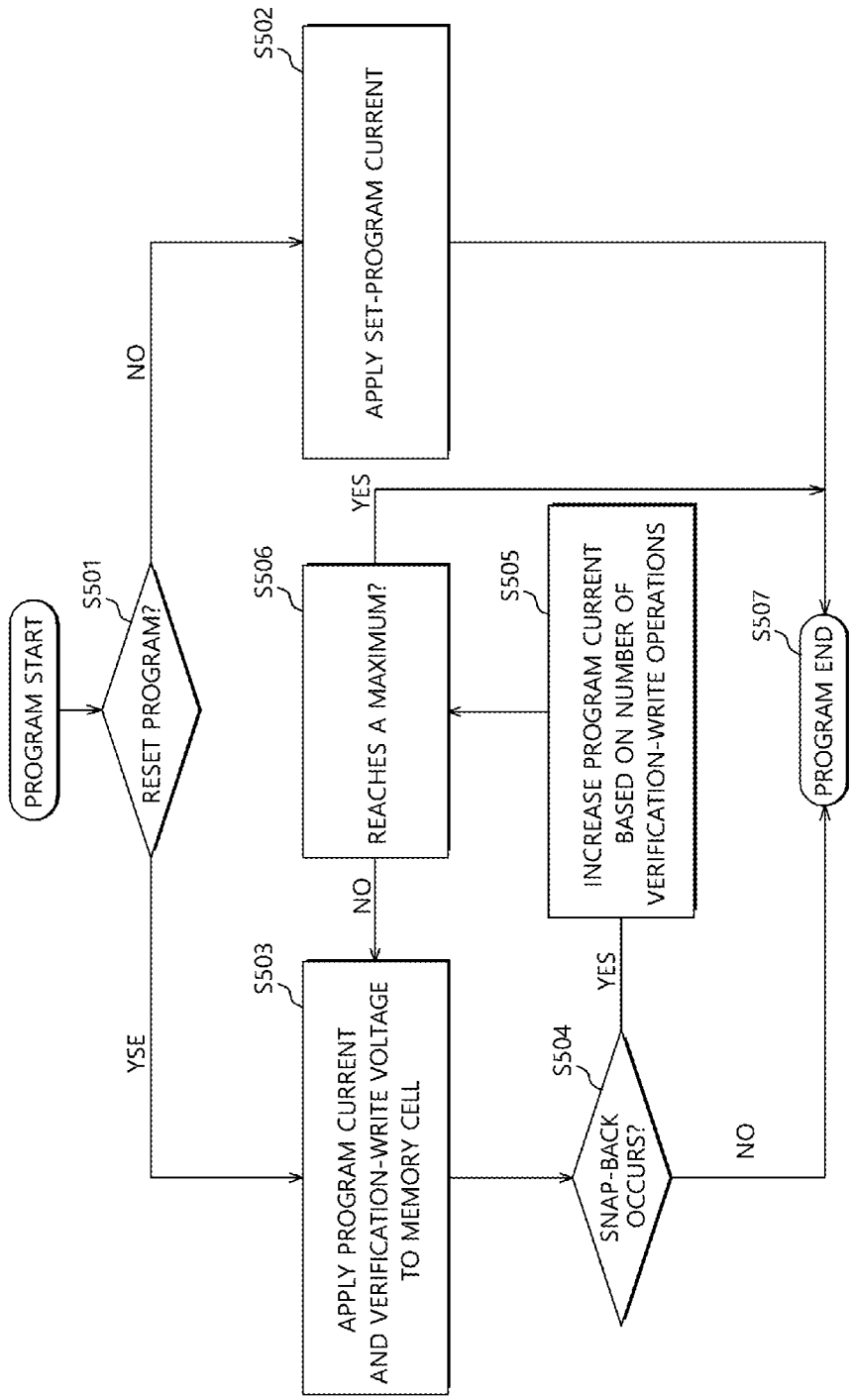
FIG. 5 is a flowchart illustrating an example operation of a non-volatile memory apparatus in accordance with an embodiment.

FIG. 5 is a flowchart illustrating an example operation of the non-volatile memory apparatus 2 in accordance with an embodiment. The operation of the non-volatile memory apparatus 2 will be described hereinafter with reference to FIGS. 2 to 5. Referring to FIG. 5, a variety of steps S501-S507 may be taken to perform the program operation on the non-volatile memory apparatus 2. At the step S501 and the step 502, when the program operation is the set program operation for writing the set data into the memory cell 201, the non-volatile memory apparatus 2 may change the memory cell 201 into the set state by applying the set program current to the memory cell 201.

At the step S501 and the step 503, when the program operation is the reset program operation for writing the reset data into the memory cell 201, the non-volatile memory apparatus 2 may clamp the memory cell current ICELL to maintain a range of the current flowing through the memory cell 201 below the initial value of the program current IRST, and may apply the verification-write voltage VRSTmin to the memory cell 201. When the snap-back occurs to the memory cell current ICELL at the step S504, the non-volatile memory apparatus 2 may increase the program current IRST at the step S505. During the snap-back, the memory cell current ICELL running through the memory cell 201 may surge. At this time, because the memory cell current ICELL is clamped to be maintained below the program current IRST, the reset data may be written into the memory cell 201 through the program current IRST when the snap-back occurs.

At the step S505, when the program current IRST increases according to the number of iterations of the verification-write operations, the memory cell current ICELL may be clamped to be maintained below the program current IRST. At the step S506, it may be determined whether the number of iterations of the verification-write operations has exceeded a predetermined number. It may also be determined whether the program current IRST and/or the value of the current update signal IUD has exceeded a maximum value thereof. If it is determined that the number of iterations of the verification-write operations has not exceeded the predetermined number and the program current IRST and/or the value of the current update signal IUD has not exceeded the maximum value thereof, the non-volatile memory apparatus 2 may apply the increased program current IRST and the verification-write voltage VRSTmin to the memory cell 201 at the step S503. If the snap-back does not occur to the memory cell current ICELL at step S504, it may be determined that the reset data has been correctly written into the memory cell 201, and the program operation may end at the step S507. When the snap-back occurs again to the memory cell current ICELL at the step S504, the steps S505, S506 and S503 may be repeated. If it is determined that the reset data has not been correctly written into the memory cell 201 even though the number of iterations of the verification-write operations and the program current IRST and/or the value of the current update signal IUD have exceeded the predetermined number and the maximum value, respectively, the memory cell 201 may be determined to be defective (e.g. failed cell), and the program operation may end. As described above, in accordance with an embodiment of the present disclosure, the non-volatile memory apparatus may perform the verification-read operation and the program operation on the memory cell at the same time, and thus the time required for the program operation may be reduced.

Although the example embodiments discussed above are about the reset program operation of the non-volatile memory apparatus, the present disclosure is not limited thereto. The set program operation and the verification-read operation are generally required for writing the set data into the memory cell. Therefore, the above description may also be applied to simultaneously performing the set program operation and the verification-read operation.

Figure 6:
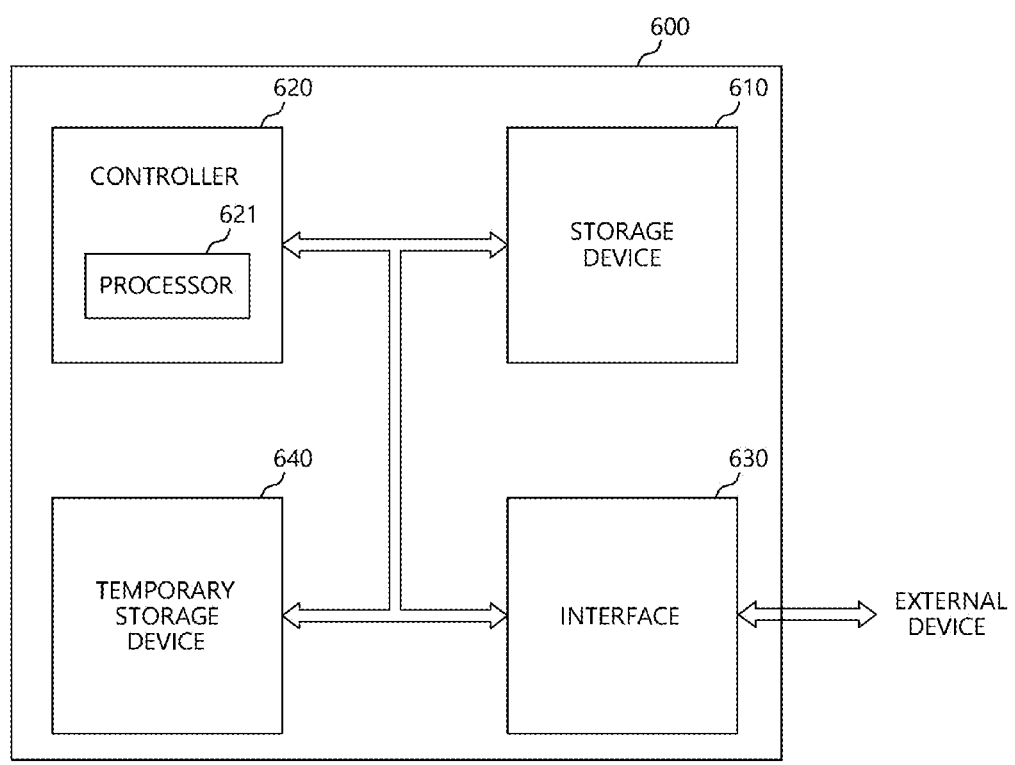
FIG. 6 is a diagram illustrating an example of a data storage system in accordance with an embodiment.

FIG. 6 is a diagram illustrating an example of a data storage system 600 in accordance with an embodiment of the present disclosure. Referring to FIG. 6, the data storage system 600 may include a non-volatile storage device 610 suitable for storing data, a control device 620 suitable for controlling the storage device 610, and an interface device 630 suitable for connecting an external device to the data storage system 600. The data storage system 600 may be of a disk type such as a hard disk drive (HDD), a compact disc read only memory (CDROM), a digital versatile disc (DVD), and a solid state disk (SSD). The data storage system 600 may be of a card type such as a universal serial bus (USB) memory, a secure digital (SD) card, a mini secure digital (mSD) card, a micro SD card, a secure digital high capacity (SDHC) card, a memory stick card, a smart media (SM) card, a multimedia card (MMC), an embedded MMC (eMMC), and a compact flash (CF) card.

The control device 620 may control data communication between the storage device 610 and the interface device 630. The control device 620 may include a processor 621 for calculating and processing commands input from the external device through the interface device 630.

The interface device 630 may be used for data communication between the data storage system 600 and the external device. In the case where the data storage system 600 is of a card type, the interface device 630 may be compatible with the universal serial bus (USB) memory, the secure digital (SD) card, the mini secure digital (mSD) card, the micro SD card, the secure digital high capacity (SDHC) card, the memory stick card, the smart media (SM) card, the multimedia card (MMC), the embedded MMC (eMMC), or the compact flash (CF) card. In the case where the data storage system 600 is of a disk type, the interface device 630 may be compatible with Integrated Device Electronics (IDE), Serial Advanced Technology Attachment (SATA), Small Computer System Interface (SCSI), External SATA (eSATA), Personal Computer Memory Card International Association (PCMCIA), or Universal Serial Bus (USB) interfaces.

The data storage system 600 may further include a temporary storage device 640 for effective data transfer between the storage device 610 and the interface device 630. The storage device 610 and the temporary storage device 640 may include the non-volatile memory device according to an embodiment of the present disclosure.

Figure 7:
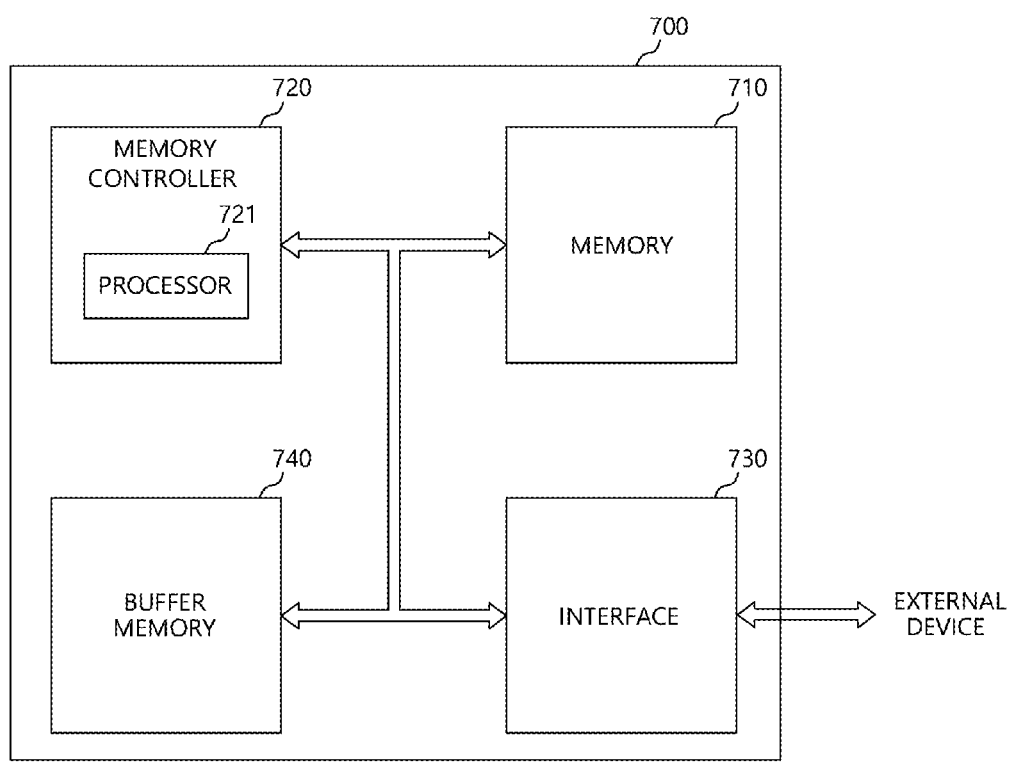
FIG. 7 is a diagram illustrating an example of a memory system in accordance with an embodiment.

FIG. 7 is a diagram illustrating an example of a memory system 700 in accordance with an embodiment of the present disclosure. Referring to FIG. 7, the memory system 700 may include a non-volatile memory device 710 suitable for storing data, a memory control device 720 controlling the memory device 710, and an interface device 730 connecting an external device to the memory system 700. The memory system 700 may be of a card type such as the solid state disk (SSD), the universal serial bus (USB) memory, the secure digital (SD) card, the mini secure digital (mSD) card, the micro SD card, the secure digital high capacity (SDHC) card, the memory stick card, the smart media (SM) card, the multimedia card (MMC), the embedded MMC (eMMC), and the compact flash (CF) card. The memory device 710 may include the non-volatile memory device according to the embodiment disclosed above.

The memory control device 720 may control data communication between the memory device 710 and the interface device 730. The memory control device 720 may include a processor 721 for calculating and processing commands input from the external device through the interface device 730.

The interface device 730 may be used for data communication between the memory system 700 and the external device. The interface device 730 may be compatible with the universal serial bus (USB) memory, the secure digital (SD) card, the mini secure digital (mSD) card, the micro SD card, the secure digital high capacity (SDHC) card, the memory stick card, the smart media card (SM), the multimedia card (MMC), the embedded MMC (eMMC), and the compact flash (CF) card.

The memory system 700 may further include a buffer memory device 740 for effective data transfer between the memory device 710 and the interface device 730. The buffer memory device 740 may include the non-volatile memory device according to an embodiment of the present disclosure.

While certain embodiments have been described above, it will be understood to those skilled in the art that the embodiments described are by way of example only. Accordingly, the non-volatile memory apparatus and the verification-write method should not be limited based on the described embodiments. Rather, the non-volatile memory apparatus and the verification-write method described herein should only be limited in light of the claims that follow when taken in conjunction with the above description and accompanying drawings.

What is claimed is:

1. A non-volatile memory apparatus comprising:
   a voltage generation circuit coupled to a memory cell and configured to provide a voltage corresponding to a verification-write voltage to the memory cell when a reset program operation is performed, wherein the verification-write voltage is a voltage at which a snap-back of the memory cell in a reset state does not occur, and has a higher voltage level than a read voltage;
   a program current generation circuit configured to increase a program current when the snap-back occurs, and to end a program operation without the program current flowing through the memory cell when the snap-back does not occur; and
   a clamping circuit coupled to the voltage generation circuit and configured to clamp the memory cell current to maintain a range of a memory cell current below the program current for the reset program operation.

2. The non-volatile memory apparatus of claim 1, further comprising a sense amplifier configured to generate a detection signal by detecting whether the snap-back occurs, wherein the program current generation circuit includes:
   a program controller configured to generate a current update signal and a program end signal based on the detection signal; and
   a clamping controller configured to generate a clamping control signal by increasing the program current according to the current update signal.

3. The non-volatile memory apparatus of claim 2, wherein the sense amplifier generates the detection signal having a first level when the memory cell current is greater than a threshold current value, and generates the detection signal having a second level when the memory cell current is less than the threshold current value.

4. The non-volatile memory apparatus of claim 2, wherein the program controller increases a value of the current update signal every time the program controller receives the detection signal having a first level.

5. The non-volatile memory apparatus of claim 4, wherein the program controller counts a number of the detection signal having the first level, and generates the program end signal when the number of the detection signal reaches a maximum.

6. The non-volatile memory apparatus of claim 4, wherein the program controller generates the program end signal when the value of the current update signal reaches a maximum.

7. The non-volatile memory apparatus of claim 4, wherein the program controller generates the program end signal in response to the detection signal having a second level.

8. The non-volatile memory apparatus of claim 2, wherein the clamping controller includes:
   a variable current source configured to increase the program current based on the current update signal; and
   a clamping control signal generator configured to generate the clamping control signal having a voltage level corresponding to an amount of the program current.

9. The non-volatile memory apparatus of claim 2, wherein the clamping circuit applies a clamping current substantially same as the program current to the voltage generation circuit in response to the clamping control signal.

10. A non-volatile memory apparatus comprising:
    a clamping circuit configured to prevent a memory cell current flowing through a memory cell from exceeding a program current for a reset program operation in response to a clamping control signal;
    a voltage generation circuit configured to receive a verification-write voltage and apply a sensing voltage to the memory cell when the reset program operation is performed, wherein the verification-write voltage is a voltage at which a snap-back of the memory cell in a reset state does not occur, and has a higher voltage level than a read voltage;
    a sense amplifier configured to generate a detection signal by detecting whether the snap-back of the memory cell occurs;
    a program controller configured to generate a current update signal and a program end signal based on the detection signal; and
    a clamping controller configured to generate the clamping control signal by increasing the program current according to the current update signal.

11. The non-volatile memory apparatus of claim 10, wherein the program controller increases a value of the current update signal every time the program controller receives the detection signal having a first level.

12. The non-volatile memory apparatus of claim 10, wherein the program controller counts a number of the detection signal having a first level, and generates the program end signal when the number of the detection signal reaches a maximum.

13. The non-volatile memory apparatus of claim 10, wherein the program controller generates the program end signal when the value of the current update signal reaches a maximum.

14. The non-volatile memory apparatus of claim 10, wherein the program controller generates the program end signal in response to the detection signal having a second level.

15. The non-volatile memory apparatus of claim 10, wherein the clamping controller includes:
    a variable current source configured to increase the program current based on the current update signal; and
    a clamping control signal generator configured to generate the clamping control signal having a voltage level corresponding to an amount of the program current.

16. The non-volatile memory apparatus of claim 10, wherein the clamping circuit applies a clamping current substantially same as the program current to the voltage generation circuit in response to the clamping control signal.

* * * * *